(12) United States Patent
Chou et al.

(10) Patent No.: US 7,394,124 B2
(45) Date of Patent: Jul. 1, 2008

(54) DYNAMIC RANDOM ACCESS MEMORY DEVICE

(75) Inventors: Jih-Wen Chou, Hsinchu (TW); Yu-Chi Chen, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 11/307,424

(22) Filed: Feb. 7, 2006

(65) Prior Publication Data

US 2007/0085123 A1    Apr. 19, 2007

(30) Foreign Application Priority Data

Oct. 13, 2005    (TW) .................................. 94135667

(51) Int. Cl.
*H01L 29/94* (2006.01)
(52) U.S. Cl. ................. 257/301; 257/296; 257/E21.652
(58) Field of Classification Search ................. 257/301, 257/296
See application file for complete search history.

(56) References Cited

U.S. PATENT DOCUMENTS

| | | | |
|---|---|---|---|
| 5,998,821 A | 12/1999 | Hieda et al. ................. 257/301 |
| 6,312,982 B1* | 11/2001 | Takato et al. ................. 438/238 |
| 6,373,085 B1 | 4/2002 | Hieda .......................... 257/301 |
| 6,417,063 B1* | 7/2002 | Petter et al. .................. 438/386 |
| 6,664,167 B2 | 12/2003 | Temmler et al. ............. 438/386 |
| 2005/0145913 A1* | 7/2005 | Katsumata et al. .......... 257/301 |
| 2007/0082444 A1* | 4/2007 | Chien .......................... 438/257 |

* cited by examiner

*Primary Examiner*—Ahmed Sefer
(74) *Attorney, Agent, or Firm*—Jianq Chyun IP Office

(57) ABSTRACT

A dynamic random access memory (DRAM) is provided. The dynamic random access memory includes a deep trench capacitor disposed in a first trench of a substrate, a conductive layer disposed in a second trench of the substrate, a gate structure, and a conductive layer disposed on the surface of the substrate at two sides of the gate structure. The depth of the second trench is smaller than the depth of the first trench, and the second trench partially overlaps with the first trench. The conductive layer disposed in the second trench is electrically connected with the conductive layer of the deep trench capacitor. The gate structure is disposed on the substrate. The conductive layer at one side of the gate structure is electrically connected with the conductive layer disposed in the second trench.

8 Claims, 7 Drawing Sheets

DYNAMIC RANDOM ACCESS MEMORY DEVICE

CROSS-REFERENCE TO RELATED APPLICATION

This application claims the priority benefit of Taiwan application serial no. 94135667, filed on Oct. 13, 2005. All disclosure of the Taiwan application is incorporated herein by reference.

BACKGROUND OF THE INVENTION

1. Field of Invention

The present invention relates to a memory device and a manufacturing method thereof. More particularly, the present invention relates to a dynamic random access memory and a manufacturing method thereof.

2. Description of Related Art

When the semiconductor industry enters the deep submicron process, the size and dimension of devices keep decreasing, and for the conventional dynamic random access memory (DRAM) structure, the space that can be used for capacitors is increasingly smaller. On the other hand, due to the huge size of computer application software, the memory capacity needs to become larger. For the trend that the dimension of the device is reduced and the memory capacity needs to be increased, the manufacturing method for the capacitor of the conventional DRAM must be modified to meet the trend.

DRAMs can be classified into two types according to their capacitor structures: one is the DRAMs having stack capacitors, and the other is the DRAMs having deep trench capacitors.

FIG. 1 is a schematic cross-sectional view of a conventional DRAM having a deep trench capacitor. Referring to FIG. 1, the DRAM includes a deep trench capacitor 10 and an active component 20.

The deep trench capacitor 10 is disposed in the deep trench 102. The deep trench capacitor 10 includes a bottom electrode 104, a capacitor dielectric layer 106, a conductive layer 108, a collar oxide layer 110, a conductive layer 112, and a silicon nitride layer 114. The bottom electrode 104 is disposed at the bottom of the deep trench 102 in the substrate 100. The conductive layer 108 is disposed in the deep trench 102. The capacitor dielectric layer 106 is disposed between the sidewalls of the deep trench 102 and the conductive layer 108. The conductive layer 112 is disposed in the deep trench 102, and above the conductive layer 108. The collar oxide layer 110 is disposed between the sidewalls of the deep trench 102 and the conductive layer 112. Further, an isolation structure 116 is disposed in parts of the collar oxide layer 110 and the conductive layer 112, and in the substrate 100. An oxide layer 118 is disposed in the deep trench 102, and above the deep trench capacitor 10. Further, a silicon nitride layer 114 is disposed between the collar oxide layer 110 and the oxide layer 118.

The active component 20 is disposed on the substrate 100. The active component 20 includes a gate structure 120 and source/drain regions 122. The gate structure 120 includes a gate dielectric layer 124, a gate 126 and a cap layer 128. The gate dielectric layer 124, the gate 126 and the cap layer 128 are sequentially disposed on the substrate 100. The source/drain regions 122 are disposed in the substrate 100 at both sides of the gate structure 120, and the source/drain region 122 at one side is connected with the silicon nitride layer 114.

When a read operation is performed on the DRAM, the current in the deep trench capacitor 10 flows to the source/drain region 122 through the silicon nitride layer 114, passes a channel region 130 under the gate structure 120, and then flows out through a contact plug (not shown). However, when the level of integration is increased and the device size is reduced, the channel region 130 under the gate structure 120 is also shortened, and a short channel effect is generated, thereby influencing the device performance. Moreover, the silicon nitride layer 114 is used as a buried strap window (BS window), resulting in a high resistance of the buried strap, which also influences the device performance. Further, when there is a positive voltage in the deep trench, the substrate outside of the BS window forms a channel, which causes the device to generate leakage current.

SUMMARY OF THE INVENTION

Accordingly, one object of the present invention is to provide a dynamic random access memory (DRAM) and a manufacturing method thereof, which omits the manufacturing of a buried strap window (BS window) to improve the device performance.

It is another object of the present invention to provide a DRAM, which can lessen the short channel effect.

One aspect of the present invention provides a manufacturing method of a DRAM. A patterning process is performed to form a deep trench in a substrate by using a patterned mask layer on the substrate. A bottom electrode is formed in the substrate at the bottom of the deep trench. Then, a capacitor dielectric layer and a first conductive layer are formed sequentially at the bottom of the deep trench. A first collar oxide layer is formed on parts of the sidewalls of the deep trench exposed by the first conductive layer. The deep trench is filled with a second conductive layer, and the height of the second conductive layer is substantially equivalent to the height of the first collar oxide layer. Then, the deep trench is filled with a first dielectric layer. Thereafter, a part of the patterned mask layer, a part of the substrate and a part of the first dielectric layer are removed to form a first trench for exposing a part of the second conductive layer. Next, a second collar oxide layer is formed on parts of the sidewalls of the first trench. The first trench is filled with a third conductive layer, and the height of the third conductive layer is substantially equivalent to the height of the second collar oxide layer. Thereafter, the first trench is filled with a second dielectric layer. Then, the patterned mask layer is removed. A gate structure is formed on the deep trench. A second trench is formed in the second dielectric layer at one side of the gate structure for exposing the third conductive layer. A fourth conductive layer is formed on the substrate, and fills the second trench.

Another aspect of the present invention further provides a DRAM, which includes a deep trench capacitor disposed in a first trench of a substrate. The substrate has a second trench, the depth of which is smaller than the depth of the first trench, and the second trench partially overlaps with the first trench. The deep trench capacitor includes a bottom electrode, a first conductive layer, a capacitor dielectric layer, and a first collar oxide layer. The bottom electrode is disposed in the substrate at the bottom of the first trench. The capacitor dielectric layer is disposed on sidewalls of the lower portion of the first trench. The first collar oxide layer is disposed on sidewalls of the upper portion of the first trench and above the capacitor dielectric layer. The first conductive layer is disposed in the first trench. Moreover, the DRAM further includes a second conductive layer, a gate structure and a third conductive layer. The second conductive layer is disposed in the second trench, and is electrically connected with the first conductive layer.

The gate structure is disposed on the substrate. The third conductive layer is disposed on the surface of the substrate at both sides of the gate structure, and the third conductive layer on one side of the gate structure is electrically connected with the second conductive layer.

Yet another aspect of the present invention further provides a manufacturing method of a DRAM. First, a first trench is formed in a substrate. A first conductive layer is formed in the first trench. Then, a second trench is formed in the substrate, wherein the second trench is shallower than the first trench, and partially overlaps with the first trench. A second conductive layer is formed in the second trench. Then, a third trench is formed in the substrate and above the second trench, wherein the depth of the third trench is smaller than the depth of the second trench. Thereafter, a third conductive layer is formed in the third trench and on the surface of the substrate, and the second conductive layer can be electrically connected with one side of the gate structure through the third conductive layer.

The DRAM described above uses the third conductive layer disposed at both sides of the gate structure as a source/drain, and the third conductive layer on one side of the gate structure extends downward to be electrically connected with the second conductive layer in the deep trench capacitor. Therefore, when the DRAM is operated, a current may flow upwardly to the substrate through the second conductive layer and the third conductive layer, and then skirt the second collar oxide layer to enter into the channel region in the substrate under the gate structure. Accordingly, the length of the channel is increased, and the short channel effect is thereby avoided. Moreover, since the DRAM omits the BS window of silicon nitride in the conventional structure, the problems of high resistance and leakage current caused by the BS window are avoided.

In order to the make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
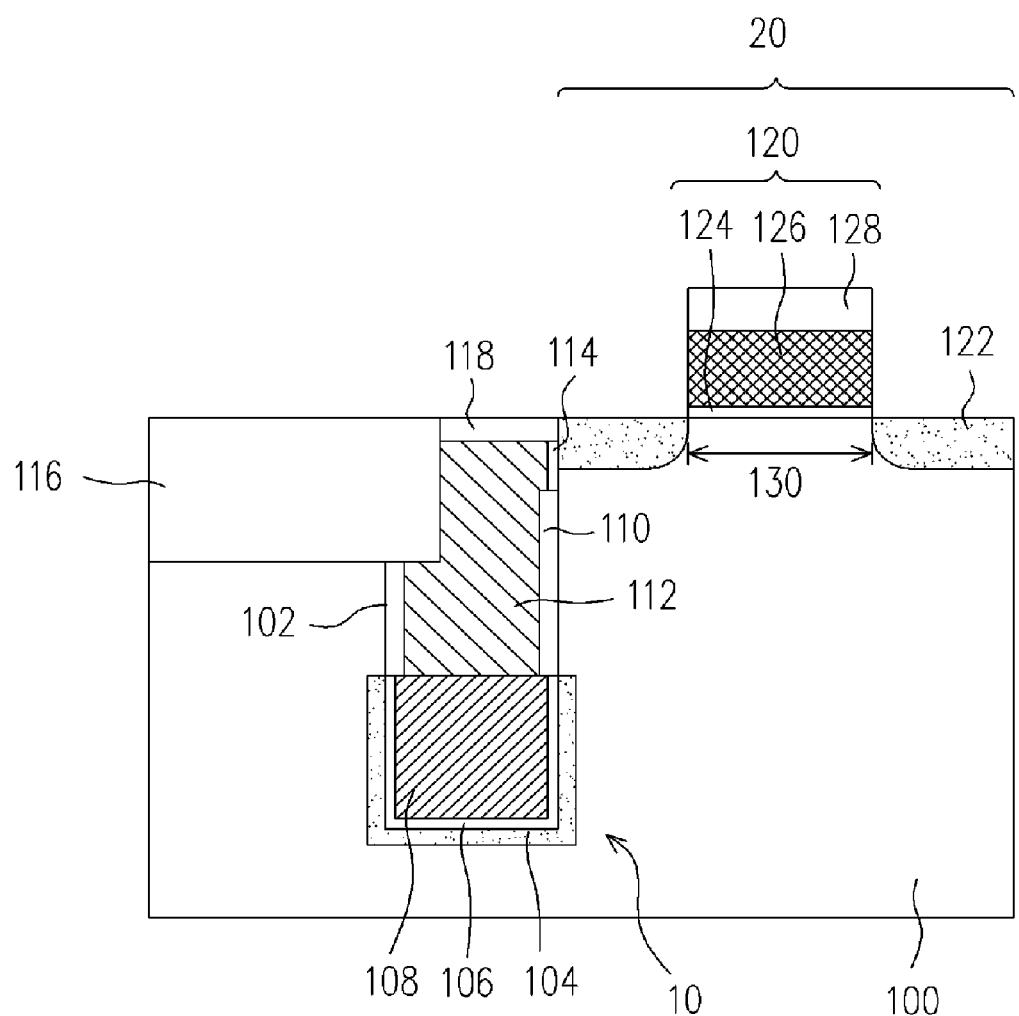
FIG. 1 is a schematic cross-sectional view of a conventional DRAM having a deep trench capacitor.
Figure 2:
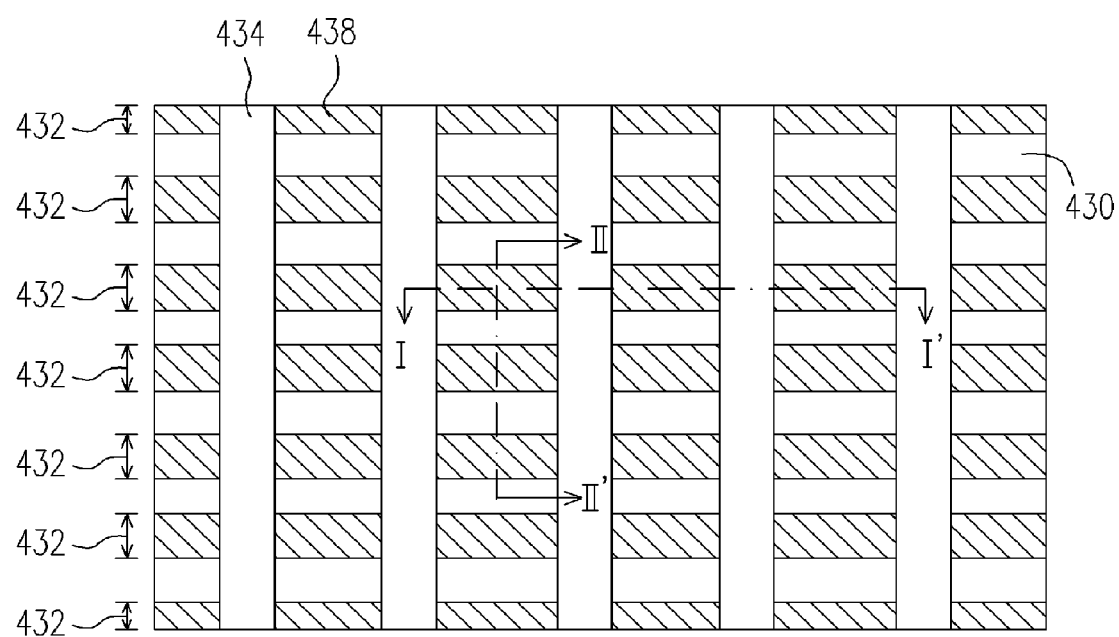
FIG. 2 is a top view of a DRAM array according to an embodiment of the present invention.

FIG. 2 is a top view of a DRAM array according to an embodiment of the present invention. FIG. 3A to FIG. 3E are cross-sectional views of the steps of the manufacturing method, according to the structure in FIG. 2 taken along the line I-I'. FIG. 4A to FIG. 4B are cross-sectional views of the steps of the manufacturing method, according to the structure in FIG. 2 taken along the line II-II'.

Figure 3A:
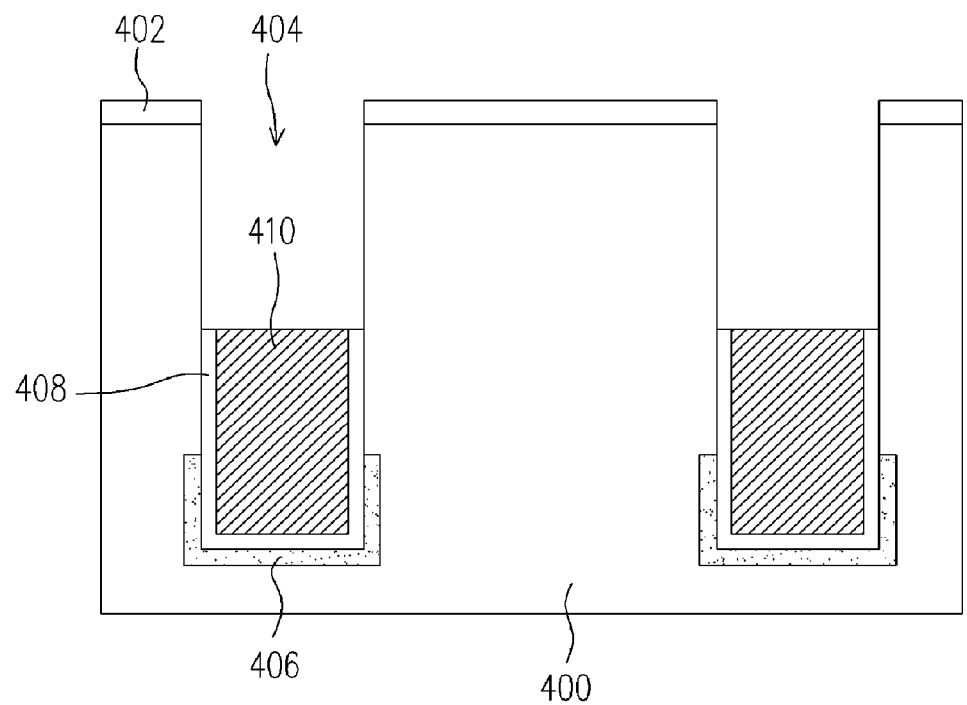
FIG. 3A to FIG. 3E are cross-sectional views of the steps of the manufacturing method, according to the structure in FIG. 2 taken along the line I-I'.
Figure 4A:
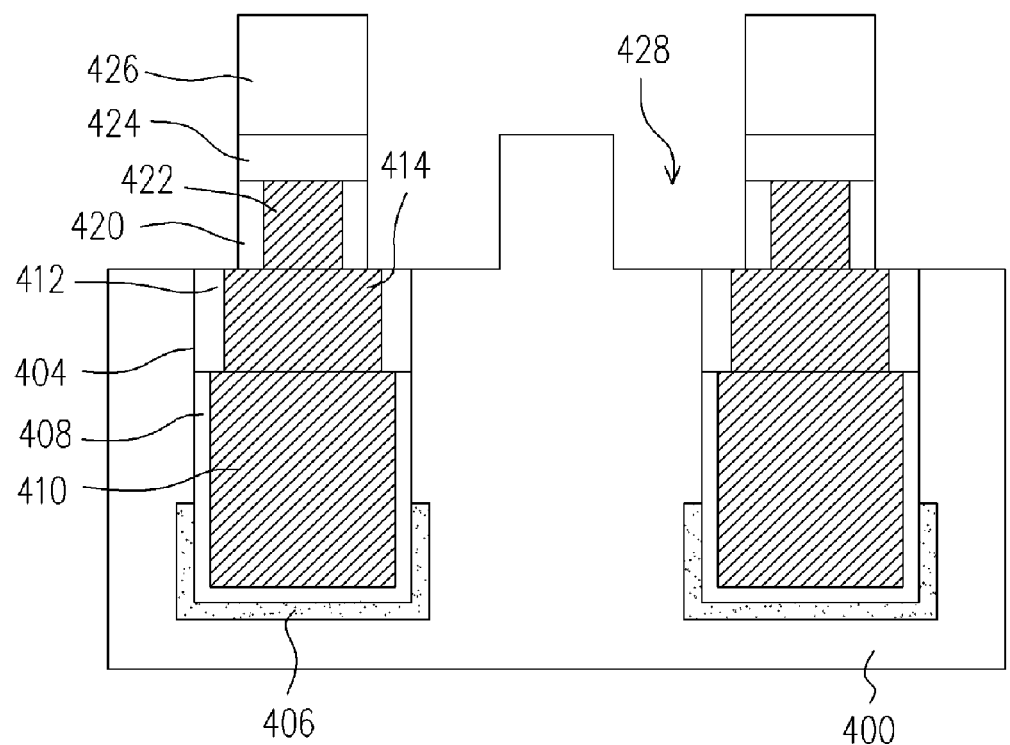
FIG. 4A to FIG. 4B are cross-sectional views of the steps of the manufacturing method, according to the structure in FIG. 2 taken along the line II-II'.
Figure 4B:
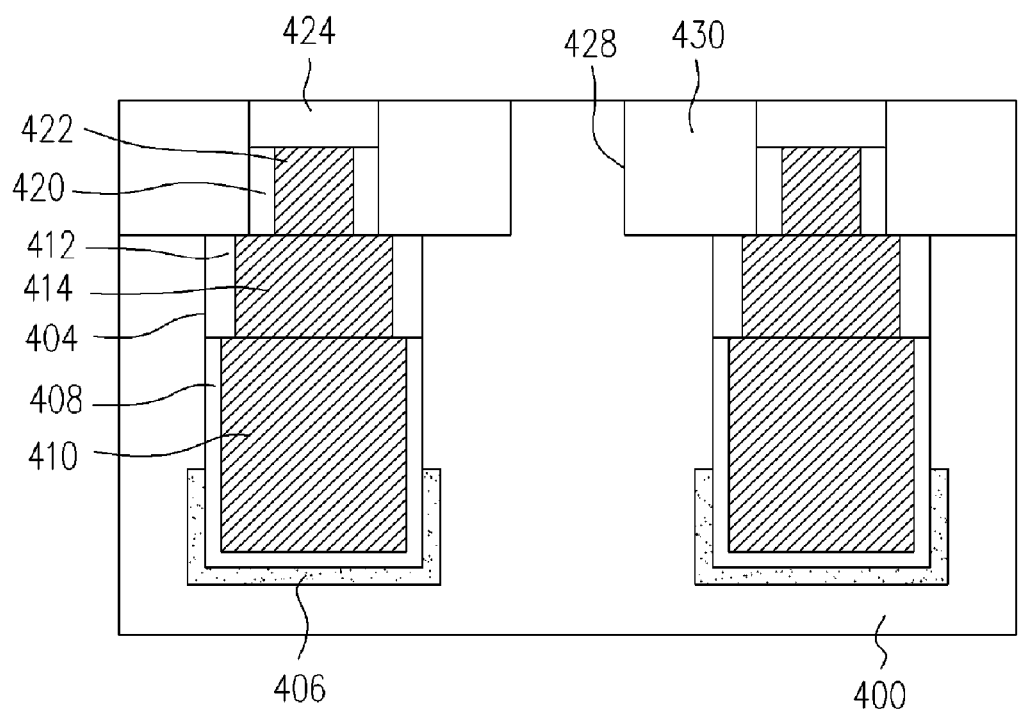

First, referring to FIG. 2 and FIG. 3A, a patterning process is performed to form a deep trench 404 in a substrate 400 by using a patterned mask layer 402 on the substrate 400. The material of the patterned mask layer 402 is, for example, silicon nitride, and the method for forming the patterned mask layer 402 is, for example, first forming a mask material layer (not shown) over the substrate 400 by chemical vapor deposition (CVD), and then performing a lithography process and an etch process to pattern the mask material layer. The method for forming the deep trench 404 is, for example, performing an etch process by using the patterned mask layer 402 as an etch mask to form the deep trench 404 in the substrate 400.

Then, still referring to FIG. 3A, a bottom electrode 406 is formed in the substrate 400 at the bottom of the deep trench 404. The method for forming the bottom electrode 406 is, for example, first forming a doped oxide layer (not shown) on sidewalls of the deep trench 404, and then, performing a thermal process, such that the dopants in the doped oxide layer diffuse to the deep trench 404, thus to form the bottom electrode 406. The dopants are, for example, arsenic ions, and the method for forming the doped oxide layer is, for example, low pressure chemical vapor deposition (LPCVD). A capacitor dielectric layer 408 is formed on the sidewalls of the deep trench 404. The material of the capacitor dielectric layer 408 is, for example, silicon oxide or silicon nitride, and the method for forming the capacitor dielectric layer 408 is, for example, thermal oxidation or CVD. A conductive layer 410 is formed at the bottom of the deep trench 404. The method for forming the conductive layer 410 is, for example, forming a doped polysilicon layer (not shown) on the substrate 400 by CVD to fill the deep trench 404, and performing an etch back process to remove the doped polysilicon layer outside the deep trench 404 and in the top portion of the deep trench 404. Afterwards, the capacitor dielectric layer 408 not covered by the conductive layer 410 is removed.

Figure 3B:
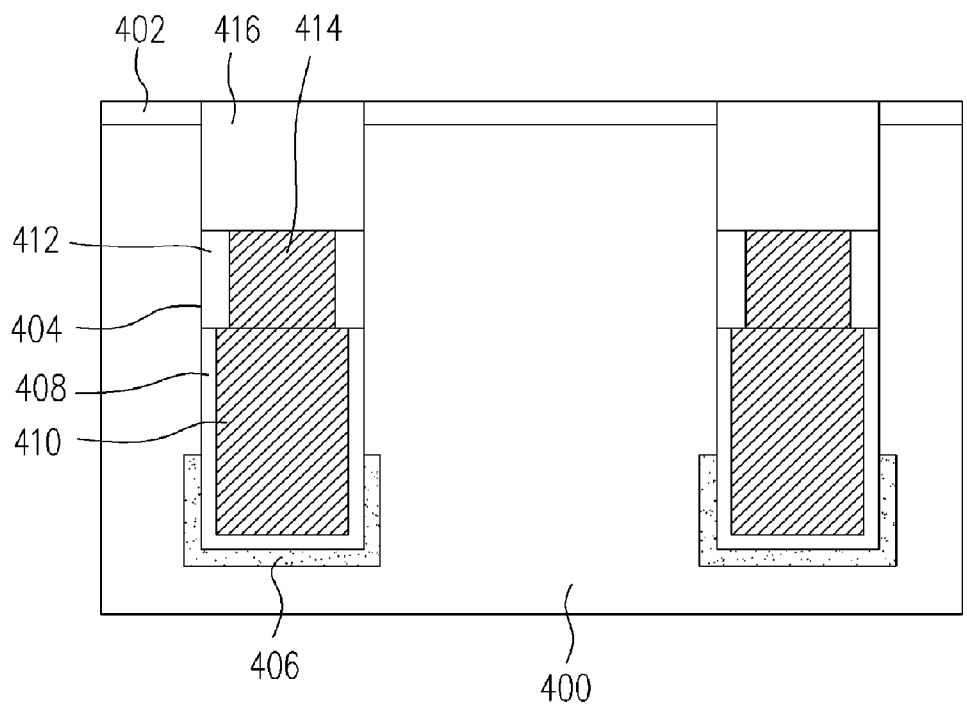

Then, referring to FIG. 3B, a collar oxide layer 412 is formed on the sidewalls of the deep trench 404 not covered by the conductive layer 410. The method for forming the collar oxide layer 412 is, for example, forming a collar oxide material layer (not shown) on the surfaces of the patterned mask layer 402 and the conductive layer 410 and on the exposed surface of the deep trench 404. The method for forming the collar oxide material layer is, for example, CVD, and the reacting gas is, for example, ozone ($O_3$) or tetraethyl orthosilicate (TEOS), etc. Then, an anisotropic etch process is performed to remove the collar oxide material layer on the surfaces of the patterned mask layer 402 and on the conductive layer 410, leaving the collar oxide layer 412 on the sidewalls of the deep trench 404.

Still referring to FIG. 3B, the deep trench 404 is filled with a conductive layer 414. The method for the filling of the deep trench 404 with the conductive layer 414 is, for example, forming a doped polysilicon layer (not shown) on the substrate 400 by CVD to fill the deep trench 404, and performing an etch back process to remove the doped polysilicon layer outside of the deep trench 404 and in the top portion of the deep trench 404, thus forming the conductive layer 414. In another embodiment, the collar oxide layer 412 exposed by the conductive layer 414 is removed to make the height of the collar oxide layer 412 substantially equivalent to the height of the conductive layer 414. Afterwards, the deep trench 404 is filled with a dielectric layer 416. The method for forming the dielectric layer 416 is, for example, forming a dielectric material layer (not shown) over the substrate 400, and performing a rapid thermal annealing process. Thereafter, a chemical-mechanical polishing process is performed by using the patterned mask layer 402 as a polishing stop layer, so as to remove the dielectric material layer outside the deep trench 404 and on the patterned mask layer 402.

Figure 3C:
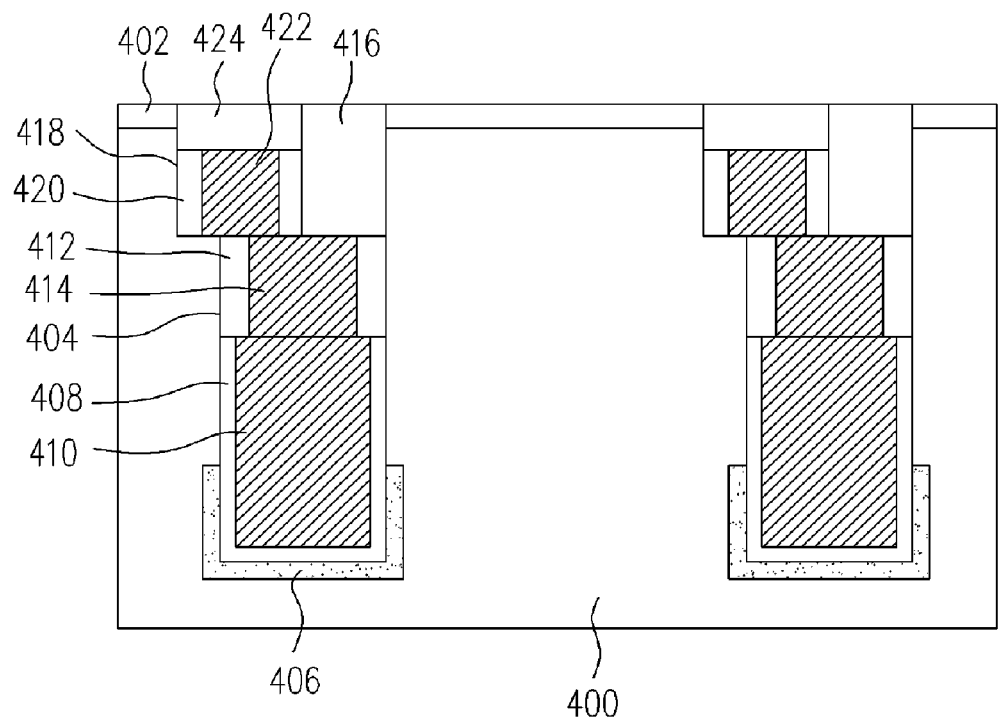

Then, referring to FIG. 3C, an etch process is performed to remove a part of the patterned mask layer 402, a part of the substrate 400 and a part of the dielectric layer 416, to form a trench 418 for exposing a part of the conductive layer 414. Next, a collar oxide layer 420 is formed on the sidewalls of the trench 418. The method for forming the collar oxide layer 420 is similar to the aforementioned method for forming the collar oxide layer 412, and will not be described herein any more. Then, the trench 418 is partially filled with a conductive layer 422, and the height of the conductive layer 422 is substantially equivalent to the height of the collar oxide layer 420. The method for the filling of the trench 418 with the conductive layer 422 is similar to the aforementioned method for the filling of the deep trench 404 with the conductive layer 414, and will not be described herein any more. Thereafter, the trench 418 is filled with a dielectric layer 424. The method for forming the dielectric layer 424 is, for example, high density plasma chemical vapor deposition (HDPCVD).

Then, referring to FIG. 2 and FIG. 4A, a patterned mask layer 426 is formed on the substrate 400 to define active regions 432, wherein the patterned mask layer 426 is in a strip shape, and covers the dielectric layer 424 in the same row. Next, an etch process is performed to form a trench 428 in the substrate 400 for exposing a part of the substrate 400 and the conductive layer 414. Then, referring to FIG. 4B, the trench 428 is filled with an isolating material (not shown) to form a shallow trench isolation structure 430 and to define the active regions 432 at the same time. The active region refers to the area covered by the patterned mask layer 426. Thereafter, the patterned mask layer 426 is removed.

Figure 3D:
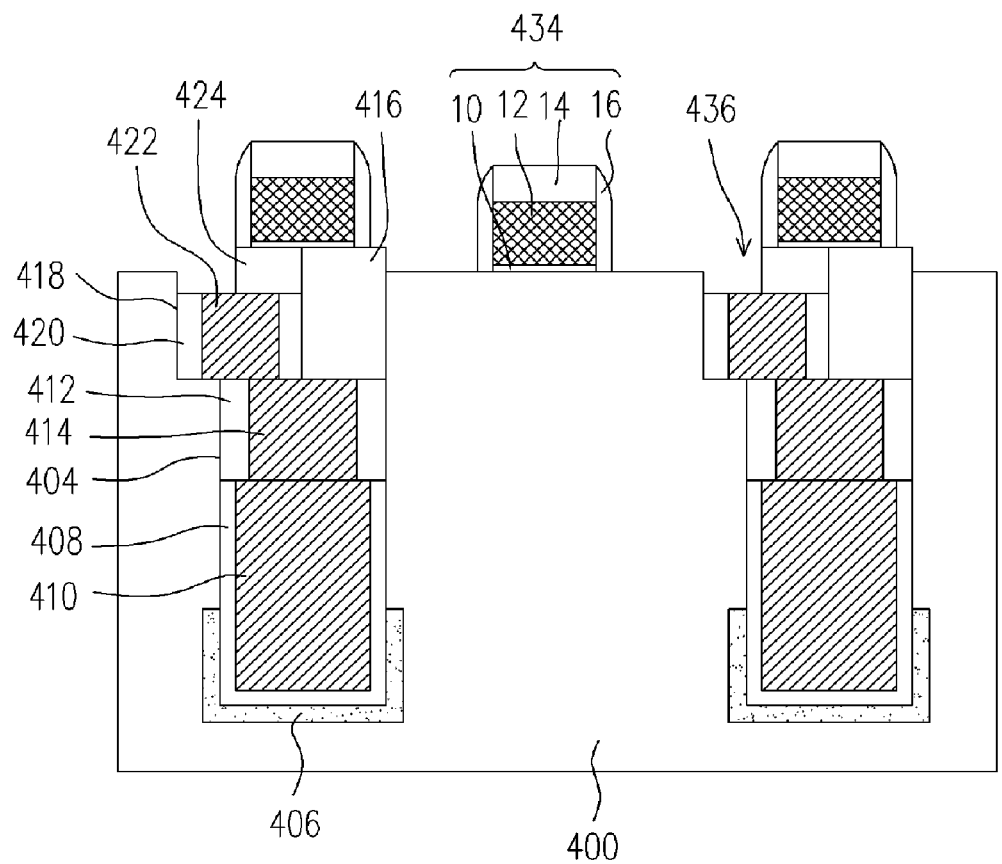

Then, referring to FIG. 2 and FIG. 3D, the patterned mask layer 402 is removed. A plurality of gate structures 434 perpendicular to the active regions 432 are formed on the substrate 400, and cross over the deep trenches 404. The gate structure 434 includes a gate dielectric layer 10, a gate 12, a cap layer 14, and spacers 16. Then, an etch process is performed to form a trench 436 in the dielectric layer 424 at one side of the gate structure 434, which is above the deep trench 404, so as to expose the conductive layer 422. In an embodiment, part of the exposed collar oxide layer 420 is removed, such that the height of the collar oxide layer 420 is substantially equivalent to the height of the conductive layer 422. It is notable that, in this embodiment, the photomask used for forming the trench 436 is the same as the photomask used for forming the trench 418; that is, only one photomask is needed to form the trench 418 and the trench 436. Moreover, the gate structure 434 can be used as a mask, so that the trench 436 is formed in a self-aligned way.

Figure 3E:
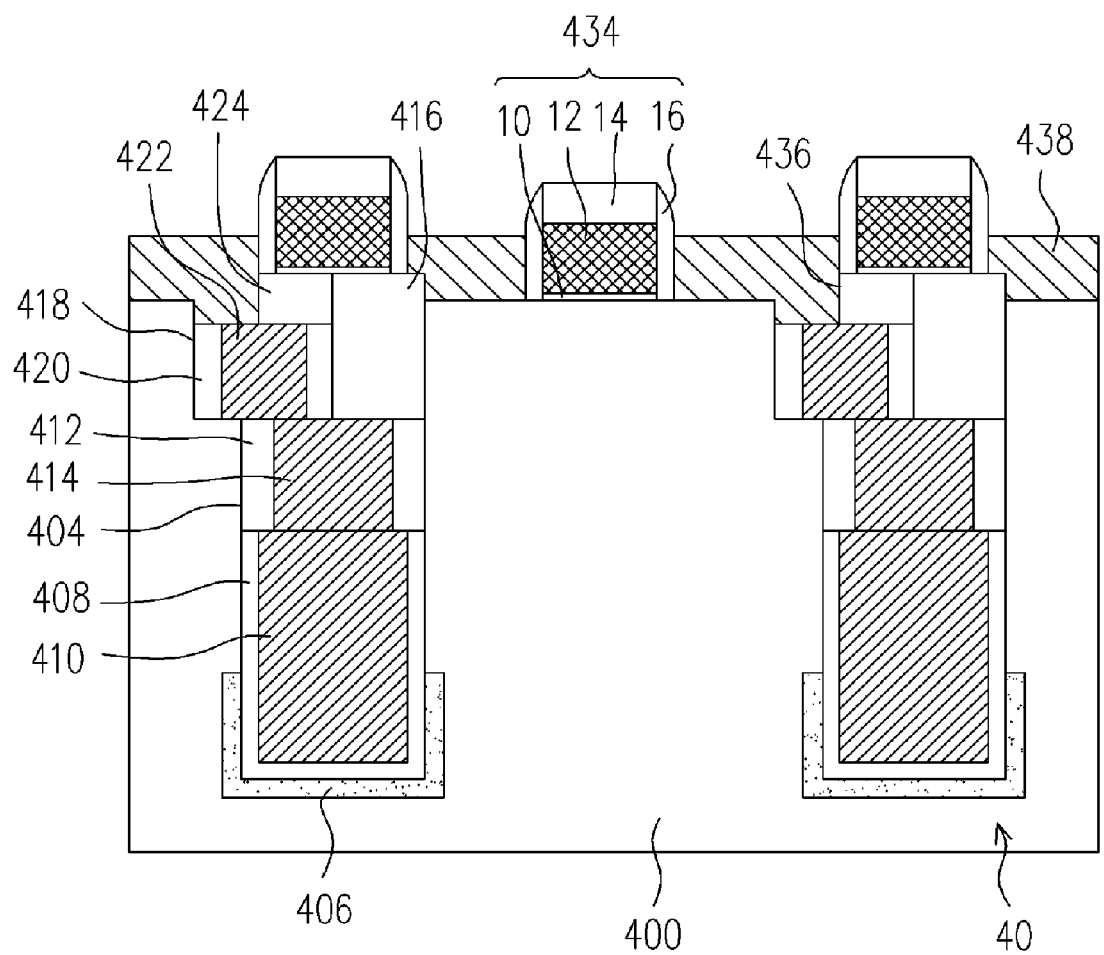

Thereafter, referring to FIG. 2 and FIG. 3E, a conductive layer 438 is formed between the gate structures 434 in the active regions 432, and fills up the trench 436. The method for forming the conductive layer 438 is, for example, performing a selective epitaxial silicon growth process, so as to form an epitaxial silicon layer over the substrate 400. The conductive layer 438 at both sides of the gate structure 434 is used as a source and a drain. Since the source and the drain in the DRAM are raised to the surface of the substrate at both sides of the gate structure, it can prevent the electric fields of the source and the drain in the substrate from influencing each other as the level of integration is increased.

The DRAM structure obtained with the aforementioned manufacturing method of DRAM will be described as followings.

Figure 5:
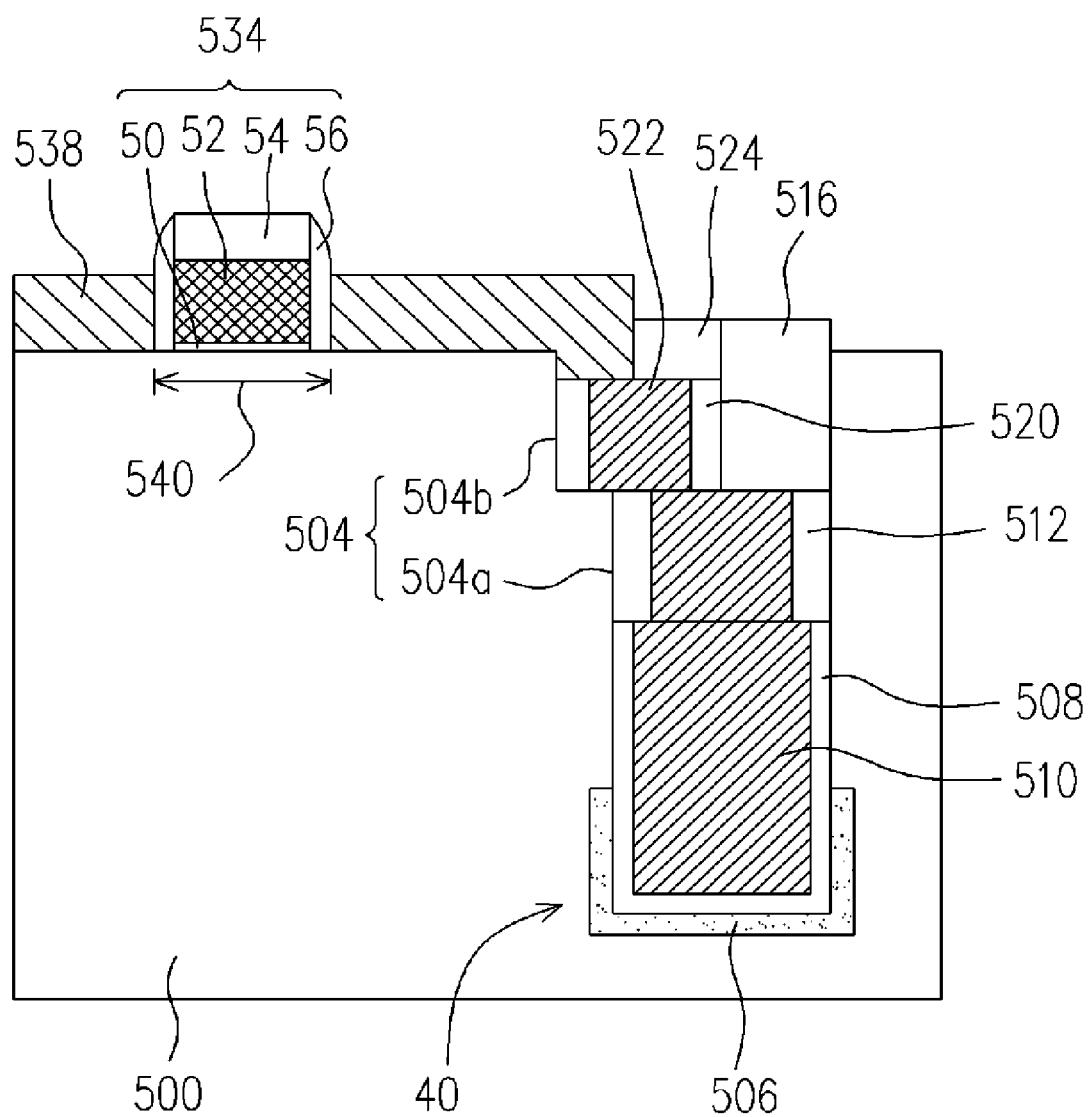
FIG. 5 is a schematic cross-sectional view of a DRAM according to an embodiment of the present invention.

FIG. 5 is a schematic cross-sectional view of a DRAM according to an embodiment of the present invention. The drawing is simplified to facilitate the descriptions. Referring to FIG. 5, the DRAM according to an embodiment of the present invention includes a deep trench capacitor 40, a conductive layer 522, a gate structure 534, and a conductive layer 538.

The deep trench capacitor 40 is disposed in a trench 504a of a substrate 500, and the substrate 500 has a trench 504b, wherein the depth of the trench 504b is smaller than the depth of the trench 504a, and the trench 504b partially overlaps with the trench 504a. The deep trench capacitor 40 includes a bottom electrode 506, a conductive layer 510, a capacitor dielectric layer 508, and a collar oxide layer 512. The bottom electrode 506 is disposed in the substrate 500 at the bottom of the trench 504a. The capacitor dielectric layer 508 is disposed on sidewalls of the lower portion of the trench 504a. The collar oxide layer 512 is disposed on sidewalls of the upper portion of the trench 504a, and above the capacitor dielectric layer 508. The conductive layer 510 is disposed in the trench 504a.

The conductive layer 522 is disposed in the trench 504b, and is electrically connected with the conductive layer 510. A collar oxide layer 520 is disposed in the trench 504b, and between sidewalls of the trench 504b and the conductive layer 522. A dielectric layer 516 is disposed on the conductive layer 510, and at one side of the trench 504b. A dielectric layer 524 is disposed on the conductive layer 522 and the collar oxide layer 520.

The gate structure 534 is disposed on the substrate 500. The gate structure 534 includes a gate dielectric layer 50, a gate 52, a cap layer 54, and a spacer 56. The material of the gate dielectric layer 50 is, for example, silicon oxide. The material of the gate 52 is, for example, polysilicon. The material of the cap layer 54 and the spacer 56 is, for example, silicon nitride.

The conductive layer 538 is disposed on the surface of the substrate 500 at both sides of the gate structure 534 and can be used as a source/drain, and the conductive layer 538 at one side of the gate structure 534 is electrically connected with the conductive layer 522. Therefore, when the DRAM is operated, a current may flow upward through the conductive layer 538 via the conductive layer 522, skirt the collar oxide layer 520, and then flow to a channel region 540 under the gate structure 534. In this way, the length of the channel is increased, and the short channel effect can be avoided.

In summary, after the deep trench capacitor is completed, a gate structure is formed on the substrate and the conductive layer 438 (538) is formed at both sides of the gate structure, and the conductive layer 438 (538) is electrically connected with the conductive layer 422 (522). Therefore, when a voltage is applied to operate the resultant DRAM, a current flows through the conductive layer 422 (522) and the conductive layer 438 (538), skirts the collar oxide layer 420 (520) and then flows to the channel region under the gate structure. Accordingly, the length of the channel is increased, and the short channel effect usually occurred in the conventional manufacturing process can be avoided. Further, because the present invention omits the manufacturing process of the BS window in the conventional technique, the high resistance caused by the BS window as well as the generation of the leakage current can be avoided. Moreover, since the conductive layer 438 (538) at both sides of the gate structure, which is used as the source/drain, is raised to the surface of the substrate, the electric fields of the source and the drain in the substrate can be prevented from influencing each other.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dynamic random access memory, comprising:
    a deep trench capacitor disposed in a first trench of a substrate, wherein the substrate further has a second trench, wherein a depth of the second trench is smaller than a depth of the first trench, and a part of the second trench overlaps with the first trench and the remained part of the second trench does not overlap with the first trench, the deep trench capacitor comprising:
        a bottom electrode disposed in the substrate at a bottom of the first trench;
        a capacitor dielectric layer disposed on a lower sidewall of the first trench;
        a first collar oxide layer disposed on an upper sidewall of the first trench and above the capacitor dielectric layer; and
        a first conductive layer disposed in the first trench;
    a second conductive layer disposed in the second trench and directly and electrically connected with the first conductive layer;
    a gate structure disposed on the substrate; and
    a third conductive layer disposed on the surface of the substrate on both sides of the gate structure, wherein the third conductive layer at one side of the gate structure is directly and electrically connected with the second conductive layer.

2. The dynamic random access memory as claimed in claim 1, wherein the third conductive layer comprises a selective epitaxial silicon growth layer.

3. The dynamic random access memory as claimed in claim 1, wherein a material of the first conductive layer comprises doped polysilicon.

4. The dynamic random access memory as claimed in claim 1, wherein a material of the second conductive layer comprises doped polysilicon.

5. The dynamic random access memory as claimed in claim 1, wherein a material of the capacitor dielectric layer comprises silicon oxide or silicon nitride.

6. The dynamic random access memory as claimed in claim 1, further comprising a second collar oxide layer disposed in the second trench and between the sidewall of the second trench and the second conductive layer.

7. The dynamic random access memory as claimed in claim 1, further comprising a first dielectric layer disposed on the first conductive layer and at a side of the second trench.

8. The dynamic random access memory as claimed in claim 1, further comprising a second dielectric layer disposed on the second conductive layer.

* * * * *